US005995380A

United States Patent [19]
Maue et al.

[11] Patent Number: 5,995,380
[45] Date of Patent: Nov. 30, 1999

[54] ELECTRIC JUNCTION BOX FOR AN AUTOMOTIVE VEHICLE

[75] Inventors: H. Winston Maue, Farmington Hills; Bert W. Eakins, Groveland Township, Oakland County, both of Mich.

[73] Assignee: Lear Automotive Dearborn, Inc., Southfield, Mich.

[21] Appl. No.: 09/076,269

[22] Filed: May 12, 1998

[51] Int. Cl.[6] .............................. H02B 1/20; H05K 1/11; H01R 9/09
[52] U.S. Cl. ......................... 361/826; 361/736; 361/752; 361/803; 174/254; 439/76.2; 439/949
[58] Field of Search ........................... 361/736, 748–751, 361/752, 784, 796, 826, 827; 174/250, 254; 29/841, 855, 856; 264/272.17; 439/76.2, 949, 931

[56] References Cited

U.S. PATENT DOCUMENTS

| | | |
|---|---|---|
| 3,854,973 | 12/1974 | Mersereau et al. . |
| 3,961,228 | 6/1976 | Briggs et al. . |
| 4,135,226 | 1/1979 | Kourimsky . |
| 4,208,080 | 6/1980 | Teagno . |
| 4,255,004 | 3/1981 | Kourimsky et al. . |
| 4,355,853 | 10/1982 | Kourimsky . |
| 4,689,718 | 8/1987 | Maue et al. . |
| 4,703,397 | 10/1987 | Minoura et al. . |
| 4,707,394 | 11/1987 | Chant . |
| 4,797,508 | 1/1989 | Chant . |
| 4,850,884 | 7/1989 | Sawai et al. . |
| 4,853,277 | 8/1989 | Chant . |
| 4,906,195 | 3/1990 | Kubota et al. . |
| 4,923,411 | 5/1990 | Hayashi et al. . |
| 5,023,752 | 6/1991 | Detter et al. . |
| 5,040,097 | 8/1991 | Stribel . |
| 5,057,026 | 10/1991 | Sawai et al. . |
| 5,107,404 | 4/1992 | Tam . |
| 5,154,647 | 10/1992 | Ishitani et al. . |
| 5,160,274 | 11/1992 | Ozaki et al. . |
| 5,207,591 | 5/1993 | Ozaki et al. . |
| 5,208,734 | 5/1993 | Someno . |
| 5,255,155 | 10/1993 | Sugimoto et al. . |
| 5,285,010 | 2/1994 | Huber . |
| 5,353,190 | 10/1994 | Nakayama et al. . |
| 5,478,244 | 12/1995 | Maue et al. . |
| 5,655,927 | 8/1997 | Maue et al. . |

FOREIGN PATENT DOCUMENTS

| | | |
|---|---|---|
| 0 209 072 A2 | 7/1986 | European Pat. Off. . |
| 0 240 453 A1 | 10/1987 | European Pat. Off. . |
| 0 567 403 A1 | 10/1993 | European Pat. Off. . |
| 0 572 052 A1 | 12/1993 | European Pat. Off. . |
| 2 502 887 | 10/1982 | France . |
| 24 09 660 | 9/1975 | Germany . |
| 30 48 451 A1 | 7/1982 | Germany . |
| 40 28 504 A1 | 3/1991 | Germany . |
| 39 36 906 A1 | 5/1991 | Germany . |
| WO 94/29145 | 3/1994 | WIPO . |

OTHER PUBLICATIONS

"Mitsui–Pathtek Process Type In–Mold Circuit Definition (Two–Shot)" 2 pages, Prior to Dec. 1, 1997.
Mitsui–Pathtek Brochure entitled "Inevitable Technology", 12 pages, prior to Dec. 1, 1997.
"Introduction to Molded Interconnect Devices", prior to Dec. 1, 1997.
6 pages of photographs illustrating a two–shot injection molded blower switch.
Chilton's Product Design and Development news magazine entitled "Molding Many Parts Into One", Dec. 1995, 4 pages.

Primary Examiner—Leo P. Picard
Assistant Examiner—Jayprakash N. Gandhi
Attorney, Agent, or Firm—Harness, Dickey & Pierce, P.L.C.

[57] ABSTRACT

An electrical junction box has a first insulating polymeric portion and a second polymeric portion defining multiple electrically conductive circuits. The circuits are at least partially separated by the first insulating polymeric portion and at least some of the circuits electrically connect together wire harness connector portions. A further aspect of the present invention junction box causes a section of the first insulating polymeric portion to concurrently act as a segment of an outer protective cover for the junction box.

24 Claims, 3 Drawing Sheets

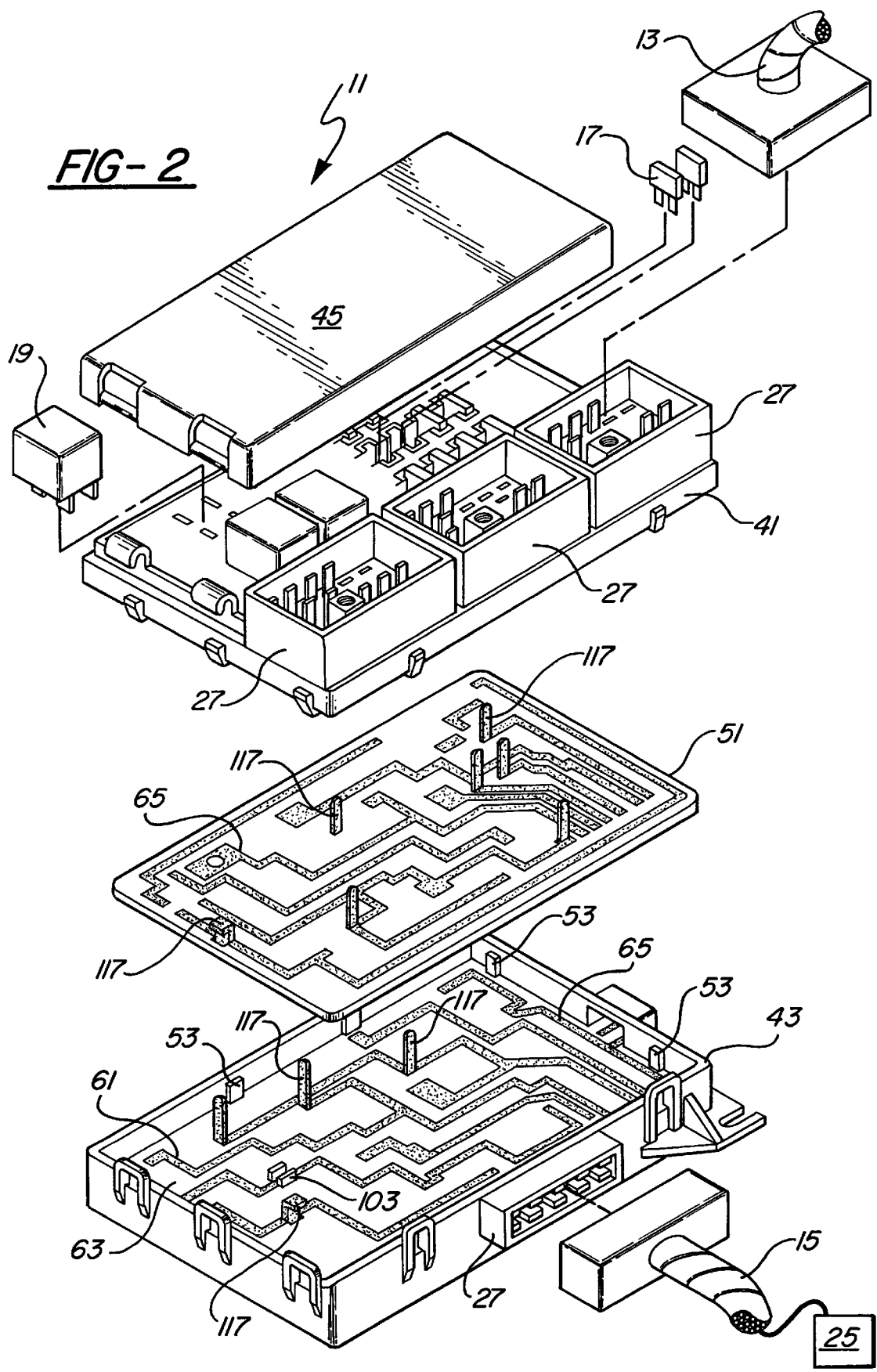

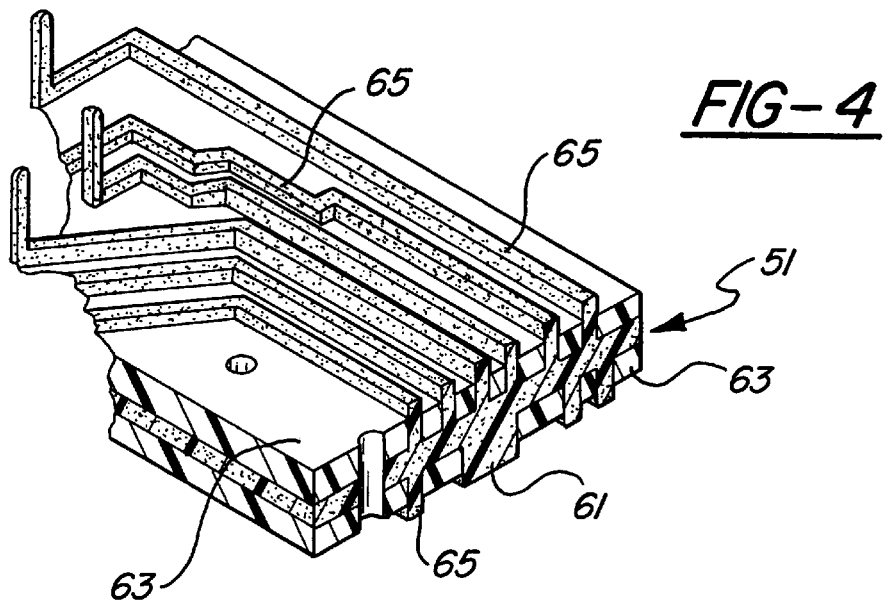
FIG-4
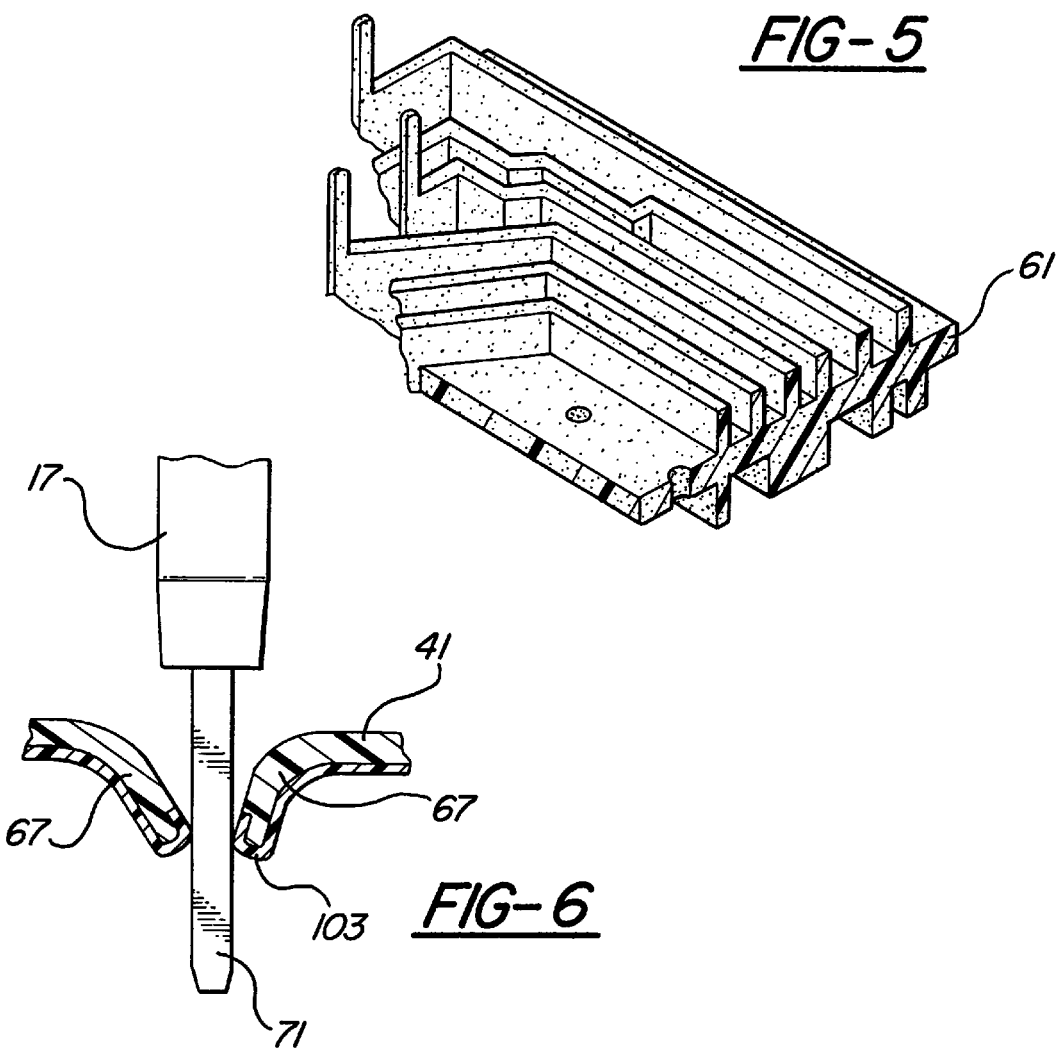
FIG-5
FIG-6

ELECTRIC JUNCTION BOX FOR AN AUTOMOTIVE VEHICLE

BACKGROUND OF THE INVENTION

This invention relates generally to electrical systems within automotive vehicles and specifically to an automotive vehicle junction box.

It is common to employ junction boxes for distributing electrical power or electricity between multiple wire harnesses and electronic components in automotive vehicles. Conventional wire harnesses have many discretely insulated copper wires that are wrapped together by tape. Many separate connector terminals and connector housings are fastened to the discrete wires. One connector for each wire harness is commonly connected to the junction box while the opposite wire harness connector is connected to an electricity activated component, such as a lamp, switch, horn, electric motor, solenoid, battery, or the like.

Examples of known junction boxes are disclosed in U.S. Pat. No. 5,478,244 entitled "Hybrid Junction Box" which issued to Maue et al. on Dec. 26, 1995, and U.S. Pat. No. 4,689,718 entitled "Programmable Junction Box" which issued to Maue et al. on Aug. 25, 1987; these patents are incorporated by reference herein.

Independent from junction boxes, it is also known to provide a two shot injection molded blower switch in an automotive vehicle which has integrally molded male blades formed with rotary switch contacts and a bulb socket. The electrically conductive areas are plated with a conductive metallic material. This part is not believed to incorporate multiple electrical harnesses or any electronic components, such as fuses or relays.

SUMMARY OF THE INVENTION

In accordance with the present invention, the preferred embodiment of an electrical junction box has a first insulating polymeric portion and a second polymeric portion defining multiple electrically conductive circuits. The circuits are at least partially separated by the first insulating polymeric portion and at least some of the circuits electrically connect together wire harness connector portions. In another aspect of the present invention, wire harness connector portions, such as male blades or female receptacles, are integrated as part of the electrically conductive circuits. A further aspect of the present invention junction box causes a section of the first insulating polymeric portion to concurrently act as a segment of an outer protective cover for the junction box. A method of forming an electrical junction box is also provided.

The electrical junction box of the present invention is advantageous over conventional devices in that the present invention significantly reduces parts, assembly effort and cost by integrating or combining components and manufacturing processes. The present invention is further advantageous by improving electrical circuit reliability through the reduction of traditionally separately connected circuits, such as alternating metal bushbars (also known as frets) and insulators. Increased amperage (up to about 33 amps) carrying ability is also provided by use of the present invention. Moreover, the insulating member of the present invention, which separates conductive circuits, also serves as an outer cover for the junction box thereby further integrating and reducing traditional components. The construction of the present invention is also more durable in the typically harsh operating environments of automotive vehicle junction boxes. Additional advantages and features of the present invention will become apparent from the following description and appended claims, taken in conjunction with the accompanying drawings.

BRIEF DESCRIPTION OF THE DRAWINGS

FIG. 2 is an exploded perspective view showing the preferred embodiment electrical junction box of the present invention;

FIG. 4 is a fragmentary perspective view showing an insulating polymeric portion molded on a second polymeric portion of the preferred embodiment electrical junction box of the present invention;

FIG. 5 is a fragmentary perspective view showing only the second polymeric portion of the preferred embodiment electrical junction box of the present invention; and FIG. 6 is an enlarged and fragmented, partially cross sectional view, taken along line 6—6 of FIG. 1, showing a fuse and the preferred embodiment electrical junction box of the present invention.

DETAILED DESCRIPTION OF THE PREFERRED EMBODIMENT

Figure 1:
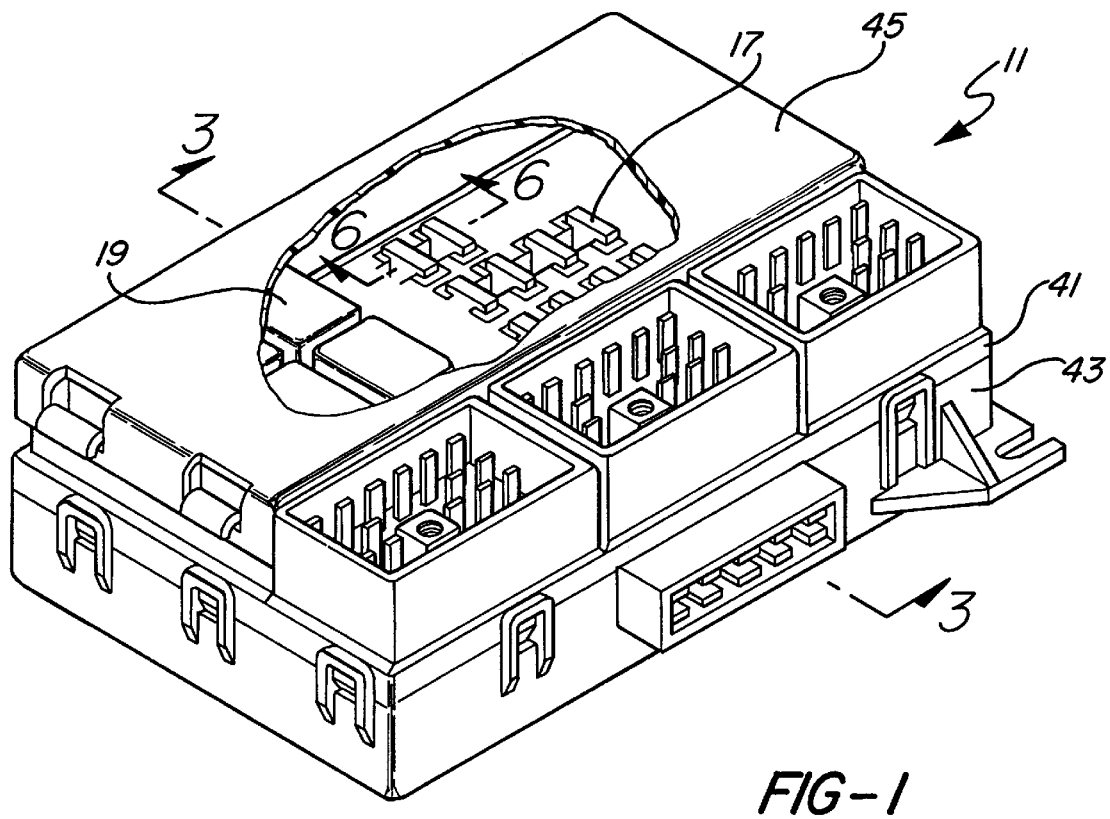
FIG. 1 is a fragmentary perspective view showing the preferred embodiment of an electrical junction box of the present invention.
Figure 3:
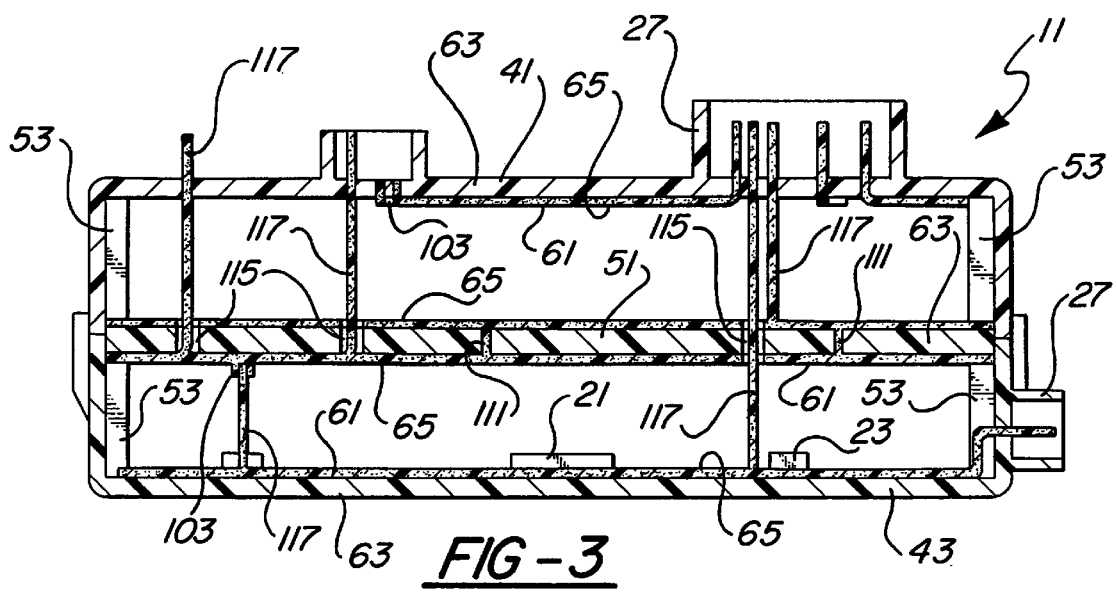
FIG. 3 is a cross sectional view, taken along line 3—3 of FIG. 1, showing the preferred embodiment electrical junction box of the present invention.

Referring to FIGS. 1–3, the preferred embodiment of an electric junction box 11, also known as a power distribution box, distributes electrical power to and from multiple wire harnesses 13 and 15, as well as to and from various electronic components mounted to junction box 11. Such electronic components include fuses 17, relays 19, microprocessors 21, diodes, SOT transistors, capacitors 23 and the like. Junction box 11 further serves to distribute power to and from a multitude of electricity activated components 25, such as lights, switches, horns, electric motors, solenoids, batteries or the like. Wire harnesses 13 and 15 employ a plurality of discretely insulated copper wires held together by externally wrapped tape. A polymeric connector block housing having metallic male or female terminals is joined to the discrete wires and allows each wire harness to become electrically connected to mating heads, also known as wire harness connectors 27, of junction box 11.

Junction box 11 preferably has a two-part plastic housing 41 and 43 (although it may alternately consist of more or less parts) and a hinged plastic cover 45 which is removable to allow external access to fuses 17 and relays 19. Furthermore, a circuit board 51 is internally disposed in housings 41 and 43 and maintained in place between standoffs 53 integrally formed with housings 41 and 43. Alternate multiple circuit boards 51 can be employed.

FIGS. 4 and 5 show how the housings and circuit board 51 are made. The exemplary circuit board 51 is made by injection molding a catalytic platable polymeric resin 61 in a first injection mold (as shown in FIG. 5). Next, a second shot of a non-catalytic polymeric resin 63 is injection molded over portions of the catalytic platable polymeric resin 61 (as is shown in FIG. 4) in a second mold. The surfaces of catalytic platable polymeric resin 61 which remain exposed after overmolding of non-catalytic polymeric resin 63 define multiple circuits 65. An adhesion promoter is applied to these exposed circuit areas and then these exposed surfaces are plated with an electroless copper which is attracted to the catalyst in catalytic platable polymeric resin 61. The polymeric resins are preferably selected from those having a relatively high heat deflection temperature. Furthermore, the copper is plated between 0.0005 and 0.002 inch thick. Non-catalytic polymeric resin 63 acts as an insulator while the raised and plated portions of catalytic platable polymeric resin 61 act as electricity carrying, conductive circuits or traces 65. Such a two-shot material system can be purchased from Molded Interconnect Devices of Rochester, N.Y. While the housings are shown as having circuits on only the internal surfaces, they may alternately have opposite circuits separated by the insulating layer like the circuit board.

Alternately, catalytic polymeric resin 61 can be replaced by spatially separated electrically conductive polymeric members that do not require plating. It is also alternately envisioned that a photo imaging process can be employed to make the housings and circuit board wherein an injection molded substrate is formed in a platable grade of thermoplastic resin. Next, the part surface is chemically prepared to accept electroless plating. A thin layer of electroless copper is then deposited on the entire surface. A photo sensitive polymer resist is then applied over the entire part, whereafter the part is exposed to ultraviolet light to harden the resist. The unexposed resist is then chemically removed, and copper and other metallic alloys are electroplated. Finally, the resist is removed from the unplated areas and the background copper is etched.

The present two-shot circuit and insulation process allows the circuits to cross over one another without a connection or short at the cross over. Stepped pass through circuit portions connect a transversely oriented bridge portion to connect circuit portion and the normally longitudinally elongated main portion of circuit. Localized bores are provided adjacent to pass through circuit portions in order to allow these areas to become plated, and thereby conductive. The backside of bridge is free of insulating polymeric member and is also thereby plated and conductive.

Referring to FIGS. 2 and 3, male blades 117, integrally formed and plated as part of the platable polymeric resin portion 61, project beyond the first insulating polymeric portion (for both housings 41 and 43, and circuit board 51) for connection to the wire harness connectors. It is envisioned that the junction box of the present invention also provides an improved heat sink over conventional devices, such as bus bars and insulators, that have an air gap between the circuits and insulators. Female connectors or terminals 103 may also be employed as part of the second polymeric portion of junction box 11, as is shown in FIGS. 3 and 6, for connection to the wire harnesses or electronic components. FIG. 6 shows the platable circuits formed to "wrap around" or be disposed on generally opposite surfaces of the insulated housing resin, thereby creating a relatively flexible female terminal or receptacle having opposing tongues 67 to grip and electrically contact a blade 71 of fuse 17. Male blades 117 are also received in integrally formed female connectors 103 entirely internal to the housing to electrically connect separate, spaced circuit layers.

Returning to FIG. 3, bridges 111 or stitches are used in circuit board 51 to electrically connect together conductive circuits 65 on opposite sides of the first insulating polymeric portion. Passageways through first insulating polymeric resin portion 63, adjacent to the second polymeric portions, may be required to allow the conductive coating to be plated on bridges 111. Moreover, pass-through holes 115 are provided to allow conductive male blades 117 to extend through first insulating polymeric portion for connection to wire harnesses, electronic components or other conductive circuits inside of junction box 11. Male blades 117 may also have L or inverted L shapes to achieve circuit-to-circuit connections within junction box 11. Electronic components 21 are affixed to circuits 65 of circuit board 51 and/or housings 41 and 43 by reflow soldering or the like.

While the preferred embodiment of a junction box has been disclosed, it should be appreciated that other constructions may fall within the scope of the present invention. For example, flexible circuit boards, conventional rigid printed circuit boards, deposit metal traces, and alternating busbar and insulating layers, can be used in combination with the two-shot polymeric construction of the present invention. Furthermore, the disclosed process for forming the integrated conductive circuit and insulating layers of the present invention may differ yet still produce the final product characteristics of the presently illustrated junction box circuits; in other words, methods other than a two-shot injection molding operation can be used to form the apparatus of the present invention. Various materials have been disclosed in an exemplary fashion, however, other materials may of course be employed. It is intended by the following claims to cover these and any other departures from the disclosed embodiments which fall within the true spirit of this invention.

The invention claimed is:

1. An electrical junction box comprising:
   a first wire harness connector portion;
   a second wire harness connector portion;
   a first insulating polymeric portion; and
   a second polymeric portion defining multiple electrically conductive circuits, said circuits being at least partially separated by said first insulating polymeric portion, at least some of said circuits electrically connecting together said first and second wire harness connector portions.

2. The junction box of claim 1 wherein said first wire harness connector portion is a section of said second polymeric portion integrally formed with at least some of said circuits.

3. The junction box of claim 2 wherein said first wire harness connector portion includes multiple elongated male blades extending beyond said first insulating polymeric portion.

4. The junction box of claim 1 further comprising a protective housing, said first and second polymeric portions being located in said housing and defining a circuit board, said electrically conductive circuits being located on opposite faces of said circuit board.

5. The junction box of claim 4 further comprising transversely oriented conductors electrically connecting together at least some of said electrically conductive circuits located on said opposite faces of said circuit board.

6. The junction box of claim 1 wherein a section of said first insulating polymeric portion defines at least a segment of a protective cover for said junction box.

7. The junction box of claim 1 further comprising at least one sharply angled step located in said first and second polymeric portions.

8. The junction box of claim 1 further comprising at least a first of said circuits crossing over a second of said circuits in a transversely offset manner with said first insulating polymeric portion disposed between said circuits at the cross over.

9. The junction box of claim 1 wherein said second polymeric portion is plated with a conductive metallic material.

10. The junction box of claim 1 wherein said second polymeric portion is made from a conductive polymeric resin.

11. The junction box of claim 1 wherein an electronic component is mounted and electrically connected to at least one of said electrically conductive circuits.

12. The junction box of claim 1 further comprising a fuse connector portion of said second polymeric portion integrally formed as part of at least some of said circuits, a fuse mounted and electrically connected to said fuse connector portion.

13. An automotive vehicle power distribution system comprising:

a first wire harness;

an electronic component; and a power distribution box including an internal member having raised segments which provide a layer for conducting electricity and said internal member having depressed segments between said raised segments which electrically insulate said raised segments from each other;

said first wire harness being electrically connected to said power distribution box;

said electronic component being electrically connected to said power distribution box;

said raised segments conducting electricity between said first wire harness and said electronic component when energized, wherein said raised segments, said depressed segments and said insulator are polymeric.

14. The power distribution system of claim 13 wherein said internal member further includes an insulator located between said raised segments.

15. The power distribution system of claim 13 further comprising a metallic plating defining said layer for conducting electricity.

16. The power distribution system of claim 13 wherein said electronic component is mounted on said internal member.

17. The power distribution system of claim 13 further comprising electrically conductive male blades extending substantially perpendicularly from said raised segments, each of said male blades extending from said respective raised segments as a single piece.

18. An automotive vehicle electrical junction box comprising:

a housing;

a first wire harness connector portion;

a second wire harness connector portion;

an insulating polymeric portion; and electrically conductive circuits being at least partially separated by said insulating polymeric portion, at least some of said circuits electrically connecting together said first and second wire harness connector portions;

at least a section of said insulating polymeric portion defining a circuit board removably spaced inside of said housing and including said insulating polymeric portion and said conductive circuits; and an electrically conductive blade extending completely through a passageway of said circuit board.

19. The junction box of claim 18 further comprising a second set of electrically conductive circuits located on a layer offset from and substantially parallel to said circuit board, said blade being attached to and projecting substantially perpendicular from one of said second set of circuits, said blade being electrically insulated from said circuits of said circuit board.

20. The junction box of claim 18 wherein said electrically conductive blade is made from a polymeric material.

21. The junction box of claim 18, further comprising:

multiple electrical components being electrically connected to said electrically conductive circuits.

22. An automotive vehicle electrical junction box comprising:

a housing;

a wire harness connector portion;

a set of electrical circuits located in said housing suitable for supplying electricity to said wire harness connector portion; and a female connector integrally formed as part of at least one of said electrical circuits, wherein at least an internal portion of said female connector is made from a polymeric material.

23. The junction box of claim 22 wherein said at least one of said electrical circuits is secured to said housing.

24. The junction box of claim 22 further comprising a male blade removably insertable in said female connector.

* * * * *